United States Patent
Jang et al.

(10) Patent No.: US 10,848,273 B2
(45) Date of Patent: Nov. 24, 2020

(54) APPARATUS AND METHOD FOR DECODING USING CYCLIC REDUNDANCY CHECK IN WIRELESS COMMUNICATION SYSTEM

(71) Applicants: Samsung Electronics Co., Ltd., Suwon-si (KR); Industry Foundation of Chonnam National University, Gwangju (KR)

(72) Inventors: Min Jang, Suwon-si (KR); Hosung Park, Gwangju (KR); Hongsil Jeong, Suwon-si (KR)

(73) Assignees: Samsung Electronics Co., Ltd., Suwon-si (KR); Industry Foundation of Chonnam National University, Gwangju (KR)

( * ) Notice: Subject to any disclaimer, the term of this patent is extended or adjusted under 35 U.S.C. 154(b) by 0 days.

(21) Appl. No.: 16/362,412

(22) Filed: Mar. 22, 2019

(65) Prior Publication Data

US 2019/0296859 A1 Sep. 26, 2019

(30) Foreign Application Priority Data

Mar. 23, 2018 (KR) ........................ 10-2018-0034021

(51) Int. Cl.
*H04L 1/00* (2006.01)

(52) U.S. Cl.
CPC .......... *H04L 1/0061* (2013.01); *H04L 1/0045* (2013.01); *H04L 1/0057* (2013.01)

(58) Field of Classification Search
CPC .... H04L 1/0061; H04L 1/0045; H04L 1/0057
See application file for complete search history.

(56) References Cited

U.S. PATENT DOCUMENTS

| | | | |
|---|---|---|---|
| 2017/0353271 A1 | 12/2017 | Kudekar et al. | |
| 2018/0076922 A1* | 3/2018 | Zhang | H04L 1/0043 |
| 2018/0097580 A1* | 4/2018 | Zhang | H03M 13/13 |
| 2018/0227076 A1* | 8/2018 | Koike-Akino | H03M 13/27 |
| 2019/0158226 A1* | 5/2019 | Hui | H04L 1/0061 |
| 2019/0273512 A1* | 9/2019 | Chen | H03M 13/13 |
| 2020/0076535 A1* | 3/2020 | Xu | H04L 1/0057 |
| 2020/0083910 A1* | 3/2020 | Dai | H03M 13/19 |

OTHER PUBLICATIONS

Hui, D., et al., "Channel Coding in 5G New Radio: A Tutorial Overview and Performance Comparison with 4G LTE", IEEE Vehicular Technology Magazine, vol. 13, Issue: 4, Date of Publication: Oct. 1, 2018, pp. 60-69. (Year: 2018).*

* cited by examiner

*Primary Examiner* — Kyle Vallecillo

(57) ABSTRACT

The disclosure is related to a pre-$5^{th}$-Generation (5G) or 5G communication system to be provided for supporting higher data rates Beyond $4^{th}$-Generation (4G) communication system such as Long Term Evolution (LTE).

A method for operating a first device in a wireless communication system includes receiving information bits and distributed cyclic redundancy check (CRC) bits from a second device, and decoding the information bits and the distributed CRC bits, wherein the information bits and the distributed CRC bits are decoded by using a successive cancellation list decoding scheme that uses a parity check matrix determined based on a linear combination of rows of a predetermined parity check matrix, or by using a successive cancellation flip decoding scheme that uses the distributed CRC bits.

20 Claims, 17 Drawing Sheets

APPARATUS AND METHOD FOR DECODING USING CYCLIC REDUNDANCY CHECK IN WIRELESS COMMUNICATION SYSTEM

CROSS-REFERENCE TO RELATED APPLICATION

This application is based on and claims priority under 35 U.S.C. § 119 to Korean Patent Application No. 10-2018-0034021, filed on Mar. 23, 2018, in the Korean Intellectual Property Office, the disclosure of which is incorporated by reference herein in its entirety.

BACKGROUND

1) Field

The disclosure relates to a wireless communication system, and more particularly to a method and apparatus for decoding using a cyclic redundancy check (CRC) in a wireless communication system.

2) Description of Related Art

To meet the demand for wireless data traffic having increased since deployment of $4^{th}$ generation (4G) communication systems, efforts have been made to develop an improved $5^{th}$ generation (5G) or pre-5G communication system. Therefore, the 5G or pre-5G communication system is also called a 'Beyond 4G Network' or a 'Post Long Term Evolution (LTE) System'.

The 5G communication system is considered to be implemented in higher frequency (mmWave) bands, e.g., 28 GHz or 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid frequency shift keying (FSK) and quadrature amplitude modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

In various communication systems including the 5G communication system, when data transmission and reception is performed between a transmitting end and a receiving end, an error correction technology may be used in order to correct data errors caused by noise from a communication channel. According to the error correction technology, when data including an additional bit is transmitted, the receiving end may correct an error that has occurred due to the state of the communication channel. Accordingly, a detailed process has been discussed in order to introduce a more effective error correction technology in the 5G system.

The above information is presented as background information only to assist with an understanding of the disclosure. No determination has been made, and no assertion is made, as to whether any of the above might be applicable as prior art with regard to the disclosure.

SUMMARY

The disclosure provides methods and apparatus for effectively decoding information in a wireless communication system.

One aspect of the disclosure provides methods and apparatus for decoding information which is encoded based on a polar code in a wireless communication system.

Another aspect the disclosure provides methods and apparatus for detecting an error using cyclic redundancy checking (CRC) bits in a wireless communication system.

Another aspect of the disclosure provides methods and apparatus for generating a matrix for detecting an error using distributed CRC bits in a wireless communication system.

Another aspect of the disclosure provides methods and apparatus for early termination of decoding of a polar code according to a distributed CRC scheme in a wireless communication system.

Another aspect of the disclosure provides methods and apparatus for performing successive cancellation flip decoding using distributed CRC in a wireless communication system.

A method for operating a first device in a wireless communication system is provided. The method includes receiving information bits and distributed cyclic redundancy check (CRC) bits from a second device, and decoding the information bits and the distributed CRC bits, wherein the information bits and the distributed CRC bits are decoded by using a successive cancellation list decoding scheme that uses a parity check matrix determined based on a linear combination of rows of a predetermined parity check matrix, or by using a successive cancellation flip decoding scheme that uses the distributed CRC bits.

An apparatus as a first device in a wireless communication system is provided. The apparatus includes a transceiver configured to receive information bits and distributed cyclic redundancy check (CRC) bits from a second device, and at least one processor configured to decode the information bits and the distributed CRC bits, wherein the information bits and the distributed CRC bits are decoded by using a successive cancellation list decoding scheme that uses a parity check matrix determined based on a linear combination of rows of a predetermined parity check matrix, or by using a successive cancellation flip decoding scheme that uses the distributed CRC bits.

Methods and apparatus according to various embodiments provide an early termination gain that is greater than when an existing error check matrix is used to perform decoding.

Methods and apparatus according to various embodiments provide a block error rate (BLER) lower than that of an existing successive cancellation flip decoding scheme.

Effects which can be acquired by the disclosure are not limited to the above described effects, and other effects that have not been mentioned may be clearly understood by those skilled in the art from the following description.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 9A illustrates an example of a linear combination associated with a predetermined parity check matrix in a wireless communication system according to various embodiments of the disclosure;

FIG. 9B illustrates an example of a linear combination associated with a predetermined parity check matrix in a wireless communication system according to various embodiments of the disclosure;

FIG. 9C illustrates an example of a linear combination associated with a predetermined parity check matrix in a wireless communication system according to various embodiments of the disclosure;

DETAILED DESCRIPTION

Figure 1:
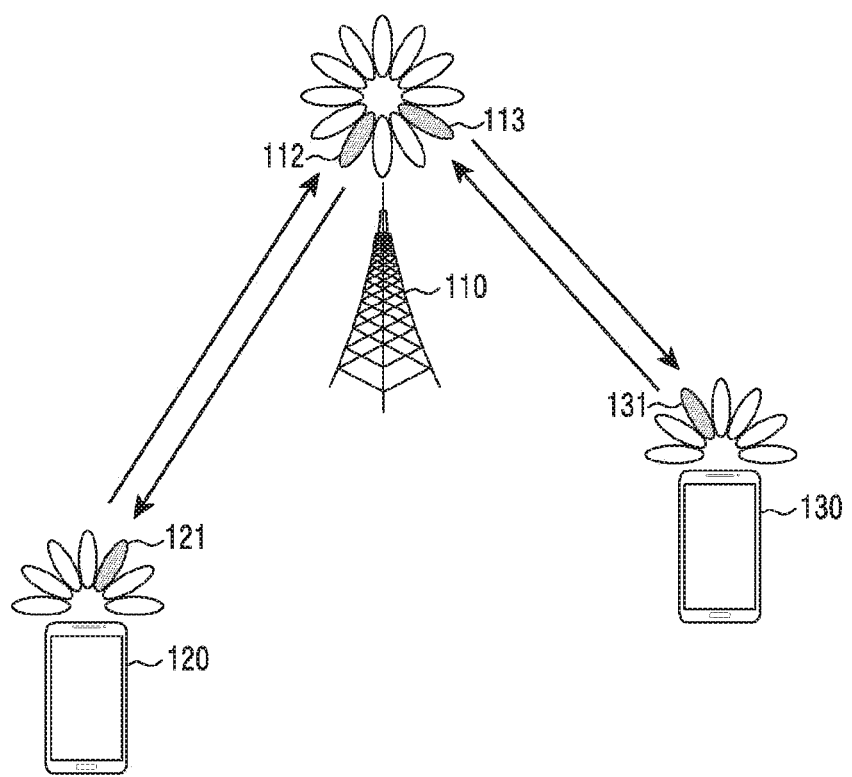
FIG. 1 illustrates an exemplary wireless communication system according to various embodiments of the disclosure.

FIGS. 1 through 14, discussed below, and the various embodiments used to describe the principles of the disclosure in this patent document are by way of illustration only and should not be construed in any way to limit the scope of the disclosure. Those skilled in the art will understand that the principles of the disclosure may be implemented in any suitably arranged system or device.

The terms used in the disclosure are only used to describe specific embodiments, and are not intended to limit the disclosure. A singular expression may include a plural expression unless they are definitely different in a context. Unless defined otherwise, all terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

Hereinafter, various embodiments of the disclosure will be described based on an approach of hardware. However, various embodiments of the disclosure include a technology that uses both hardware and software and thus, the various embodiments of the disclosure may not exclude the perspective of software.

The disclosure relates to an apparatus and method for controlling antennas in a wireless communication system. In detail, the disclosure provides a technology for selectively activating at least some of antenna arrays in a wireless communication system.

In the following description, terms indicating signals, terms indicating channels, terms indicating control information, terms indicating states of an apparatus, terms indicating the kinds of sensors, terms indicating network entities, terms indicating components of an apparatus, etc. are exemplified for the convenience of description. Accordingly, the disclosure is not limited to the terms to be described hereafter and other terms having equivalent meanings may be used.

Although various embodiments are described using terms that are used in some communication standards in the disclosure, they are only examples for description. Various embodiments may be easily modified to be applied to other communication systems.

The disclosure relates to a method and apparatus for decoding using a cyclic redundancy check (CRC) in a wireless communication system. Particularly, the disclosure describes a technology for generating a parity check matrix using distributed CRC bits and decoding information bits based on CRC bits of the parity check matrix in order to check whether an error exists in information bits obtained by decoding a signal transmitted from a transmitter to a receiver in a wireless communication system that uses a polar code. Also, the disclosure describes a technology for determining a location of a bit where an error occurs based on the distributed CRC bits and decoding information bits based on the location of the error bit in the wireless communication system. In various embodiments, parity bits may be used instead of CRC bits.

Hereinafter, terms indicating signals, terms indicating channels, terms indicating control information, terms indicating network entities, terms indicating elements of an apparatus, and the like used in the descriptions are for ease of description. Accordingly, the disclosure is not limited to the following terms, and other terms having the same technical meaning may be used.

Also, although the disclosure provides various embodiments using the terms in some communication standards (e.g., 3rd generation partnership project (3GPP)), the terms are merely used for the purpose of description. Various embodiments may be easily modified and applied to other communication systems.

FIG. 1 illustrates a wireless communication system according to various embodiments of the disclosure. FIG. 1 illustrates a base station 110, a terminal 120, and a terminal 130 as some of nodes that use a radio channel in a wireless communication system. Although a single base station is illustrated in FIG. 1, another base station that is the same as or similar to the base station 110 may be further included.

The base station 110 may be a network infrastructure that provides radio access to the terminals 120 and 130. The base station 110 may have coverage defined as a predetermined geographic area based on the distance to which the base station 110 is capable of transmitting a signal. The base station 110 may be referred to as an "access point (AP)", "eNodeB (eNB)", "5th-generation node (5G node)", "wireless point", "transmission/reception point (TRP)", or other terms having equivalent technical meaning, in addition to "base station".

Each of the terminal 120 and the terminal 130 is a device used by a user, and may perform communication with the base station 110 via a radio channel. Depending on the case, at least one of the terminals 120 and 130 may operate without being handled by a user. That is, at least one of the terminal 120 and the terminal 130 may be a device that performs machine-type communication (MTC), and may not be carried by a user. Each of the terminal 120 and the terminal 130 may be referred to as a "user equipment (UE)", "mobile station", "subscriber station", "remote terminal", "wireless terminal", "user device", or other terms having the equivalent technical meaning, in addition to "terminal".

The base station 110, the terminal 120, and the terminal 130 may transmit and receive a radio signal in a millimeter wave (mmWave) band (e.g., 28 GHz, 30 GHz, 38 GHz, or 60 GHz). In this instance, to improve a channel gain, the base station 110, the terminal 120, and the terminal 130 may perform beamforming. Here, the beamforming may include transmission beamforming and reception beamforming. That is, the base station 110, the terminal 120, and the terminal 130 may assign directivity to a transmission signal or a reception signal. To this end, the base station 110 and the terminals 120 and 130 may select serving beams 112, 113, 121, and 113 via a beam search or beam management procedure. After the serving beams 112, 113, 121, and 131 are selected, communication may be performed via resources that are in a quasi co-located (QCL) relationship with resources used for transmitting the serving beams 112, 113, 121, and 131.

If the large-scale characteristics of a channel that transmits a symbol on a first antenna port can be inferred from a channel that transmits a symbol on a second antenna port, it is regarded that the first antenna port and the second antenna port are in a QCL relationship. For example, the large-scale characteristics may include at least one of a delay spread, a Doppler spread, a Doppler shift, an average gain, an average delay, and a spatial receiver parameter.

Figure 2:
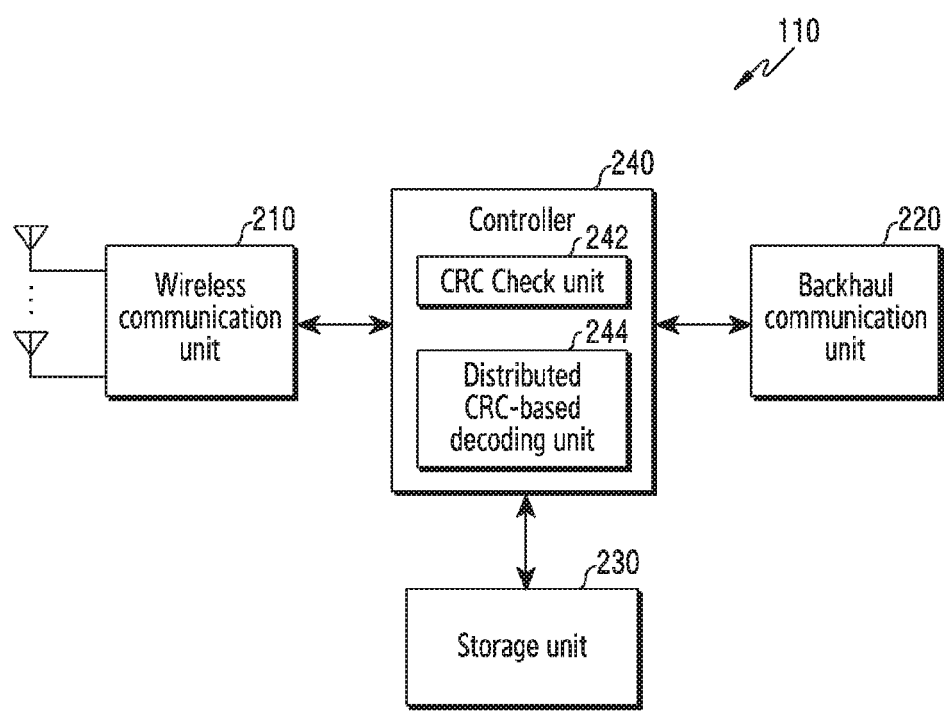
FIG. 2 illustrates an exemplary configuration of a base station in a wireless communication system according to various embodiments of the disclosure.

FIG. 2 illustrates a configuration of a base station in a wireless communication system according to various embodiments of the disclosure. The configuration of FIG. 2 may be understood as part of the configuration of the base station 110. The term " . . . unit", " . . . er" used hereinafter may refer to a unit for processing at least one function or operation, and may be implemented as hardware, software, or a combination of hardware and software.

Referring to FIG. 2, the base station includes a wireless communication unit 210, a backhaul communication unit 220, a storage unit 230, and a controller 240.

The wireless communication unit 210 performs functions for transmitting and receiving signals via a radio channel. For example, the wireless communication unit 210 performs a function of conversion between a baseband signal and a bit stream according to the physical layer standard of the system. For example, when data is transmitted, the wireless communication unit 210 generates complex symbols by encoding and modulating a transmission bit stream. Also, when data is received, the wireless communication unit 210 restores a reception bit stream by demodulating and decoding a baseband signal.

Also, the wireless communication unit 210 up-converts a baseband signal into a radio-frequency (RF) band signal to transmit the same via an antenna, and down-converts an RF band signal received via an antenna into a baseband signal. To this end, the wireless communication unit 210 may include a transmission filter, a reception filter, an amplifier, a mixer, an oscillator, a digital-to-analog convertor (DAC), an analog-to-digital convertor (ADC), and the like. Also, the wireless communication unit 210 may include a plurality of transmission and reception paths. Furthermore, the wireless communication unit 210 may include at least one antenna array including a plurality of antenna elements.

From the perspective of hardware, the wireless communication unit 210 may include a digital unit and an analog unit, and the analog unit may include a plurality of subunits according to an operating power, an operating frequency, or the like. The digital unit may be implemented as at least one processor (e.g., a digital signal processor (DSP)).

The wireless communication unit 210 transmits and receives a signal as described above. Accordingly, the entirety or a part of the wireless communication unit 210 may function as a transmitter, a receiver, or a transceiver. Also, the transmission and reception performed via a radio channel, which is described in the following descriptions, may be understood to mean that the above-described processing is performed by the wireless communication unit 210.

The backhaul communication unit 220 provides an interface for performing communication with other nodes within the network. That is, the backhaul communication unit 220 converts a bit stream transmitted from the base station to another node, for example, another access node, another base station, an upper node, a core network, or the like, into a physical signal, and converts a physical signal received from another node into a bit stream.

The storage unit 230 may store data, such as a basic program for operating a base station, an application, configuration information, and the like. The storage unit 230 may be configured as a volatile memory, a non-volatile memory, or a combination of a volatile memory and a non-volatile memory. In addition, the storage unit 230 may provide data stored therein in response to a request from the controller 240.

The controller 240 controls the overall operation of the base station. For example, the controller 240 may transmit and receive a signal via the wireless communication unit 210 or the backhaul communication unit 220. Further, the controller 240 records data in the storage unit 230 and reads data recorded therein. The controller 240 may perform the functions of a protocol stack required by the communication standard. According to another implementation, the protocol stack may be included in the wireless communication unit 210. To this end, the controller 240 may include at least one processor.

According to various embodiments, the controller 240 may include a CRC check unit 242 and a distributed CRC-based decoding unit 244. The CRC check unit 242 may perform error checking on CRC bits distributed via interleaving. The distributed CRC-based decoding unit 244 may determine at least one CRC bit on which early termination is to be performed by a linear combination associated with a predetermined parity check matrix generated using the distributed CRC bits, and may perform control such that the wireless communication unit 210 decodes information bits and distributed CRC bits based on the at least one determined CRC bit. Here, the predetermined parity check matrix may be stored in the storage unit 230. Also, the distributed CRC-based decoding unit 244 may perform control such that the wireless communication unit 210 performs successive cancellation flip decoding based on distributed CRC bits.

Here, the CRC check unit 242 and the distributed CRC-based decoding unit 244, which are instruction sets or codes stored in the storage unit 230, may be instructions/codes that reside at least temporarily in the controller 240, storage space that stores instructions/codes, or a part of a circuitry included in the controller 240.

According to various embodiments, the controller 240 may determine at least one CRC bit on which early termination is to be performed based on a linear combination associated with a predetermined parity check matrix generated using the distributed CRC bits, and may perform control such that the wireless communication unit 210 decodes information bits and distributed CRC bits based on the at least one determined CRC bit or such that the wireless communication unit 210 performs successive cancellation flip decoding based on the distributed CRC bits. For example, the controller 240 may perform control such that the base station performs operations according to various embodiments to be described below. According to various embodiments, the base station 110 may operate as a transmitting end (transmitting node) or a receiving end (receiving node).

Figure 3:
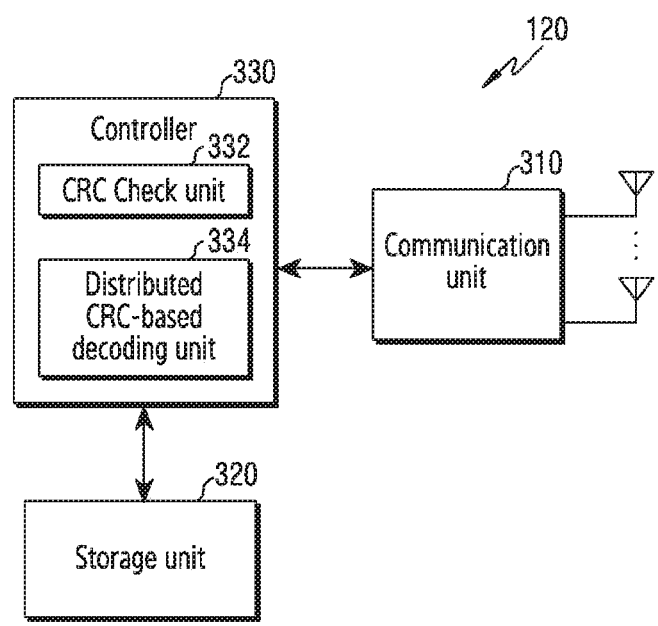
FIG. 3 illustrates an exemplary configuration of a terminal in a wireless communication system according to various embodiments of the disclosure.

FIG. 3 illustrates a configuration of a terminal in a wireless communication system according to various embodiments of the disclosure. The configuration of FIG. 3 may be understood as part of the configuration of the terminal 120. The term " . . . unit", " . . . er" used hereinafter may refer to a unit for processing at least one function or operation, and may be implemented as hardware, software, or a combination of hardware and software.

Referring to FIG. 3, the terminal includes a wireless communication unit 310, a storage unit 320, and a controller 330.

The wireless communication unit 310 may perform functions for transmitting and receiving a signal via a radio channel. For example, the wireless communication unit 310 performs a function of conversion between a baseband signal and a bit stream according to the physical layer standard of the system. For example, when data is transmitted, the wireless communication unit 310 generates complex symbols by encoding and modulating a transmission bit stream. Also, when data is received, the wireless communication unit 310 restores a reception bit stream by demodulating and decoding a baseband signal. Also, the wireless communication unit 310 up-converts a baseband signal into an RF band signal to transmit the same via an antenna, and down-converts an RF band signal received via an antenna into a baseband signal. For example, the wireless communication unit 310 may include a transmission filter, a reception filter, an amplifier, a mixer, an oscillator, a DAC, an ADC, and the like.

The wireless communication unit 310 transmits and receives a signal as described above. Accordingly, the entirety or a part of the wireless communication unit 310 may be referred to as a "transmitting unit", a "receiving unit", or a "transceiving unit". Also, the transmission and reception performed via a radio channel, which is described in the following descriptions, may be understood to mean that the above-described processing is performed by the wireless communication unit 310.

The storage unit 320 may store data, such as a basic program for operating a terminal, an application, configuration information, and the like. The storage unit 320 may be configured as a volatile memory, a non-volatile memory, or a combination of a volatile memory and a non-volatile memory. In addition, the storage unit 320 may provide data stored therein in response to a request from the controller 330.

The controller 330 may control the overall operation of a terminal. For example, the controller 330 may transmit and receive a signal via the wireless communication unit 310. Further, the controller 330 records data in the storage unit 320 and reads data stored therein. The controller 330 may perform the functions of a protocol stack required by the communication standard. To this end, the controller 330 may include at least one processor or microprocessor, or may be a part of the processor. Also, a part of the wireless communication unit 310 and the controller 330 may be referred to as a communication processor (CP).

According to various embodiments, the controller 330 may include a CRC check unit 332 and a distributed CRC-based decoding unit 334. The CRC check unit 332 may perform an error checking on CRC bits distributed via interleaving. The distributed CRC-based decoding unit 334 may determine at least one CRC bit on which early termination is to be performed based on a linear combination associated with a predetermined parity check matrix generated using the distributed CRC bits, and may perform control such that the wireless communication unit 310 decodes information bits and the distributed CRC bits based on the at least one determined CRC bit. Here, the predetermined parity check matrix may be stored in the storage unit 320. Also, the distributed CRC-based decoding unit 334 may perform control such that the wireless communication unit 310 performs successive cancellation flip decoding based on distributed CRC bits. Here, the CRC check unit 332 and the distributed CRC-based decoding unit 334, which are instruction sets or code stored in the storage unit 330, may be instructions/code residing at least temporarily in the controller 330, a storage space that stores instructions/code, or a part of a circuitry included in the controller 330.

According to various embodiments, the controller 330 may determine at least one CRC bit on which early termination is to be performed based on a linear combination associated with a predetermined parity check matrix generated using the distributed CRC bits, and may perform control such that the wireless communication unit 310 decodes information bits and the distributed CRC bits based on the at least one determined CRC bit or such that the wireless communication unit 310 performs successive cancellation flip decoding based on the distributed CRC bits. For example, the controller 330 may perform control such that the terminal performs operations according to various embodiments to be described below. According to various embodiments, the terminal 120 may operate as a transmitting end or a receiving end.

Figure 4:
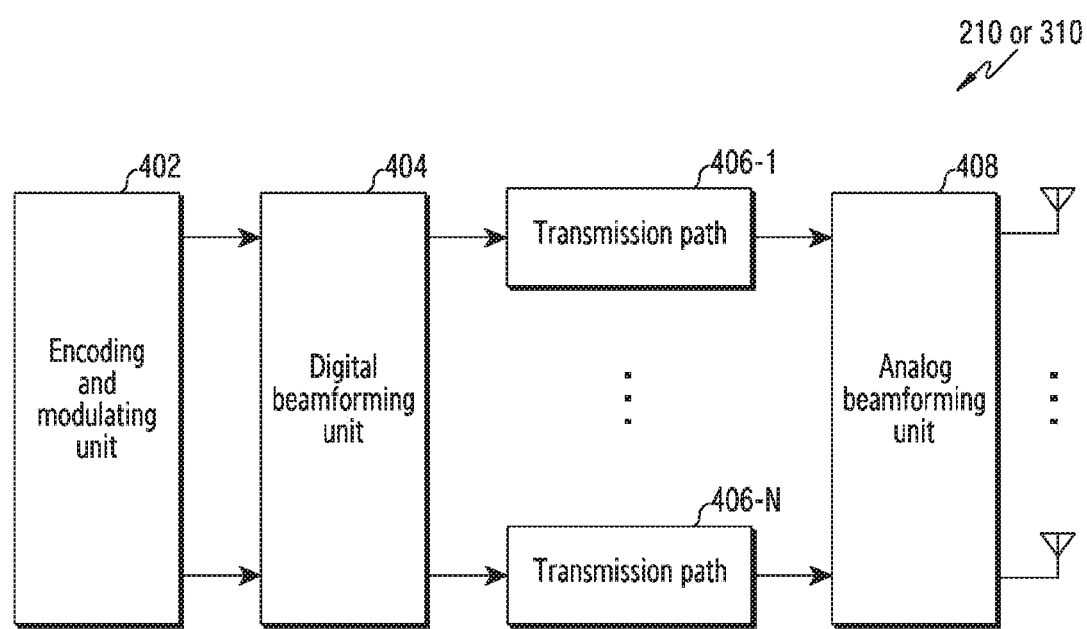
FIG. 4 illustrates an exemplary configuration of a communication unit in a wireless communication system according to various embodiments of the disclosure.

FIG. 4 illustrates a configuration of a communication unit in a wireless communication system according to various embodiments of the disclosure. FIG. 4 illustrates an example of the detailed configuration of the wireless communication unit 210 of FIG. 2 or the wireless communication unit 310 of FIG. 3. Particularly, FIG. 4 illustrates components for performing beamforming, which are part of the wireless communication unit 210 of FIG. 2 or the wireless communication unit 310 of FIG. 3.

Referring to FIG. 4, the wireless communication unit 210 or the wireless communication unit 310 may include an encoding and modulating unit 402, a digital beamforming unit 404, a plurality of transmission paths 406-1 to 406-N, and an analog beamforming unit 408.

The encoding and modulating unit 402 may perform channel encoding. To perform channel encoding, at least one of a low-density parity check (LDPC) code, a convolution code, and a polar code may be used. The encoding and modulating unit 402 may generate modulated symbols by performing constellation mapping.

The digital beamforming unit 404 may perform beamforming with respect to a digital signal (e.g., modulated symbols). To this end, the digital beamforming unit 404 may multiply the modulated symbols by beamforming weights. Here, the beamforming weights may be used to change the magnitude and the phase of a signal, and may be referred to as a "precoding matrix", a "precoder", or the like. The digital beamforming unit 404 may output digital beamformed modulated symbols to the plurality of transmission paths 406-1 to 406-N. In this instance, according to a multiple-input multiple-output (MIMO) transmission scheme, the modulated symbols may be multiplexed, or the same modulated symbols may be provided to the plurality of transmission paths 406-1 to 406-N.

The plurality of transmission paths 406-1 to 406-N may convert the digital-beamformed digital signals into analog signals. To this end, each of the plurality of transmission paths 406-1 to 406-N may include an inverse fast Fourier transform (IFFT) operation unit, a cyclic prefix (CP) insertion unit, a DAC, and an up-conversion unit. The CP insertion unit is for an orthogonal frequency division multiplexing (OFDM) scheme, and the case in which another physical layer scheme (e.g., filter bank multi-carrier (FBMC)) is applied may be excluded. That is, the plurality of transmission paths 406-1 to 406-N may provide an independent signal-processing process for a plurality of streams generated via digital beamforming. Depending on the implementation scheme, some of the elements of the plurality of transmission paths 406-1 to 406-N may be used in common.

The analog beamforming unit 408 may perform beamforming with respect to an analog signal. To this end, the digital beamforming unit 404 may multiply the analog signals by beamforming weights. Here, the beamforming weights may be used for changing the magnitude and the phase of a signal. Particularly, the analog beamforming unit 408 may be variously configured according to the connection structure of the plurality of transmission paths 406-1 to 406-N and antennas. For example, each of the plurality of transmission paths 406-1 to 406-N may be connected to a single antenna array. As another example, the plurality of transmission paths 406-1 to 406-N may be connected to a single antenna array. As yet another example, the plurality of transmission paths 406-1 to 406-N may be adaptively connected to a single antenna array or to two or more antenna arrays.

Hereinafter, the disclosure describes an apparatus that performs encoding as a transmitting end (transmitting node) and an apparatus that performs decoding as a receiving end (receiving node). In the case of downlink communication, the transmitting end may be a base station (e.g., the base station 110) and the receiving end may be a terminal (e.g., the terminal 120 and the terminal 130). In the case of uplink communication, the transmitting end may be a terminal (e.g., the terminal 120 and the terminal 130) and the receiving end may be a base station (e.g., the base station 110).

Generally, when a signal transmitted from the transmitting end to the receiving end is decoded in the wireless communication system, a CRC scheme may be used in order to detect whether an error exists in bits. CRC is a kind of a cyclic code which is good at error detection. The transmitting end inserts CRC bits behind information bits using a predetermined CRC generator polynomial and transmits the same. The receiving end may use the predetermined CRC generator polynomial so as to perform error detection with respect to received information bits and CRC bits. As described above, according to the normal CRC scheme, CRC bits obtained from information bits may be appended to information bits and may be transmitted.

In the case of a code that uses sequential decoding (e.g., successive cancellation decoding, list decoding, and the like), such as a polar code, when CRC bits are disposed behind information bits, the receiving end may be incapable of excluding a wrong decoding path via error correction before the final decoding is completed. Therefore, the transmitting end may distribute CRC bits so as to be located among information bits via interleaving in order to perform early termination or the like, whereby the amount of operations to be executed when the receiving end performs decoding may be reduced. Here, "early termination" indicates an operation that determines whether an error occurs using a corresponding CRC bit with respect to all of a plurality of lists when an error associated with received information bits is detected, does not proceed with decoding any longer when it is determined that an error occurs in all lists, and determines that decoding fails.

In the case in which the receiving end uses the above-described CRC scheme in order to detect whether an error exists in decoded information bits, the disclosure proposes a technology that distributes CRC bits via interleaving, and generates a parity check matrix and a check relational expression in order to detect an error for each distributed bit. Also, the disclosure proposes a technology that improves the performance of error correction of successive cancellation flip decoding and reduces the complexity of an operation using an early termination feature of distributed CRC bits and the fact that respective bits are disposed in different locations.

Figure 5:
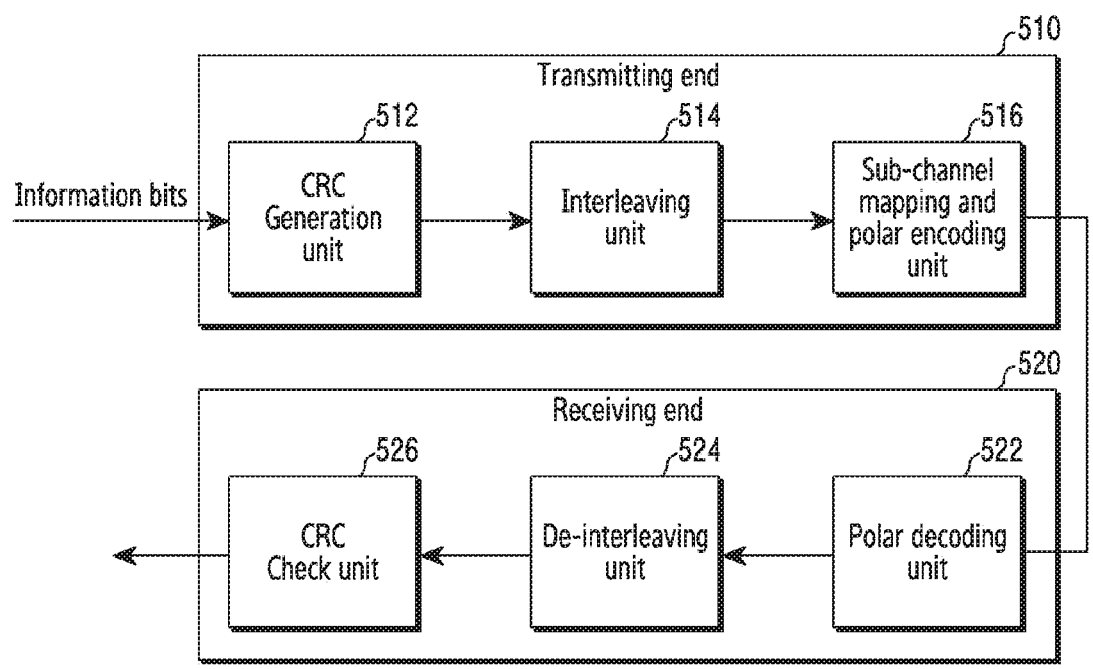
FIG. 5 illustrates an exemplary transmitting end and an exemplary receiving end which perform encoding and decoding in a wireless communication system according to various embodiments of the disclosure.

FIG. 5 illustrates a transmitting end and a receiving end that perform encoding and decoding in a wireless communication system according to various embodiments of the disclosure. The transmitting end and the receiving end of FIG. 5 may be a base station (e.g., the base station 110) and a terminal (e.g., the terminal 120). For example, in the case of downlink communication, the transmitting end may be understood to be a base station and the receiving end may be understood to be a terminal. As another example, in the case of uplink communication, the transmitting end may be understood to be a terminal and the receiving end may be understood to be a base station.

Referring to FIG. 5, a transmitting end 510 may include a CRC generation unit 512, an interleaving unit 514, and a sub-channel mapping and polar encoding unit 516. The receiving end 520 may include a polar decoding unit 522, a de-interleaving unit 524, and a CRC detection unit 526.

The CRC generation unit 512 may generate CRC bits to be connected to information bits. For example, the CRC generation unit 512 may divide information bits to be transmitted by a predetermined CRC generator polynomial, and may determine the remainder to be CRC bits. Also, the CRC generation unit 512 may connect the generated CRC bits behind the information bits. The interleaving unit 514 may design an interleaver using a feature of the CRC generator polynomial in order to produce distributed CRC. Also, the interleaving unit 514 may pass information bits and the CRC bits connected to the information bits through the designed interleaver so that the information bits and the CRC bits are interleaved. The sub-channel mapping and polar encoding unit 516 may perform sub-channel mapping and polar encoding. That is, the sub-channel mapping and polar encoding unit 516 may encode the interleaved information bits and CRC bits via polar encoding.

The polar decoding unit 522 may receive encoded signals and perform polar decoding of the encoded signals. The de-interleaving unit 524 may perform de-interleaving of decoded bits. The CRC detection unit 526 may perform CRC detection. According to an embodiment, the CRC detection unit 526 may perform error checking on each bit of the distributed CRC bits and may perform early termination. In this instance, a relational expression for error checking for each bit exists, and the relational polynomial indicates the case in which the binary sum of some information bits and corresponding CRC bits becomes 0. The above-described relational expression may be derived from the CRC generator polynomial, and a generator matrix may be determined from the CRC generator polynomial. For example, the generator matrix may be defined by a CRC generator polynomial as Equation 1 below.

$$G=[IP] \qquad \text{[Equation 1]}$$

In Equation 1, G denotes a generator matrix determined based on a CRC generator polynomial, I denotes a unit matrix, and P denotes a CRC bit matrix. A parity check matrix corresponding to the generator matrix may be defined as Equation 2 below.

$$H=[P^T I] \qquad \text{[Equation 2]}$$

In Equation 2, H denotes a parity check matrix, PT denotes a transposed matrix of a CRC bit matrix, and I denotes a unit matrix. Each row of the parity check matrix H may indicate an error check relational expression of each CRC bit. According to various embodiments, each row of a matrix obtained by applying a column permutation to the parity check matrix H may indicate a CRC bit check relational expression.

Figure 6:
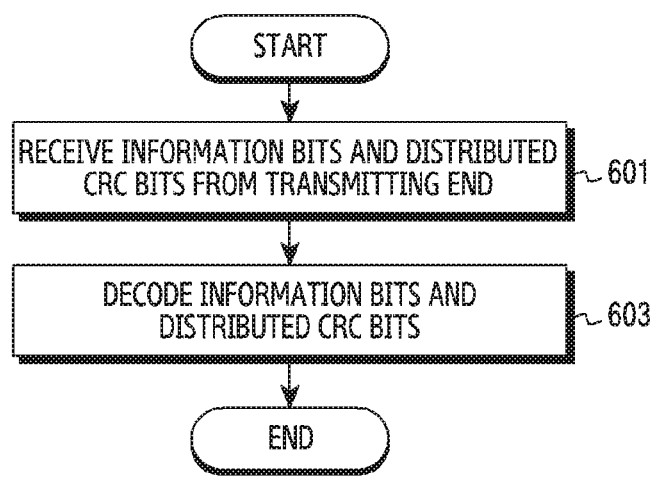
FIG. 6 is a flowchart illustrating an exemplary process in which a receiving end performs decoding using distributed cyclic redundancy check (CRC) in a wireless communication system according to various embodiments of the disclosure.

FIG. 6 is a flowchart illustrating a process in which a receiving end performs decoding using distributed CRC in a wireless communication system according to various embodiments of the disclosure. FIG. 6 illustrates the operation method of the base station 110 or the terminal 120 as the operation of the receiving end.

Referring to FIG. 6, in operation 601, the receiving end may receive information bits and distributed CRC bits from a transmitting end. That is, the receiving end may receive the information bits and distributed CRC bits from the transmitting end via interleaving. In other words, the receiving end may receive a bit stream including the distributed CRC bits.

In operation 603, the receiving end may decode the information bits and the distributed CRC bits. According to various embodiments, the receiving end may determine at least one CRC bit on which early termination is to be performed based on a linear combination associated with a predetermined parity check matrix generated using the distributed CRC bits, and may decode the information bits and the CRC bits based on the at least one determined CRC bit. According to various embodiments, the receiving end may perform successive cancellation flip decoding based on the distributed CRC bits. Through the above, the receiving end may decrease the complexity of an operation since early termination is performed, may decrease the complexity of an operation of successive cancellation flip decoding, and may more accurately select candidate bits for flipping.

Figure 7:
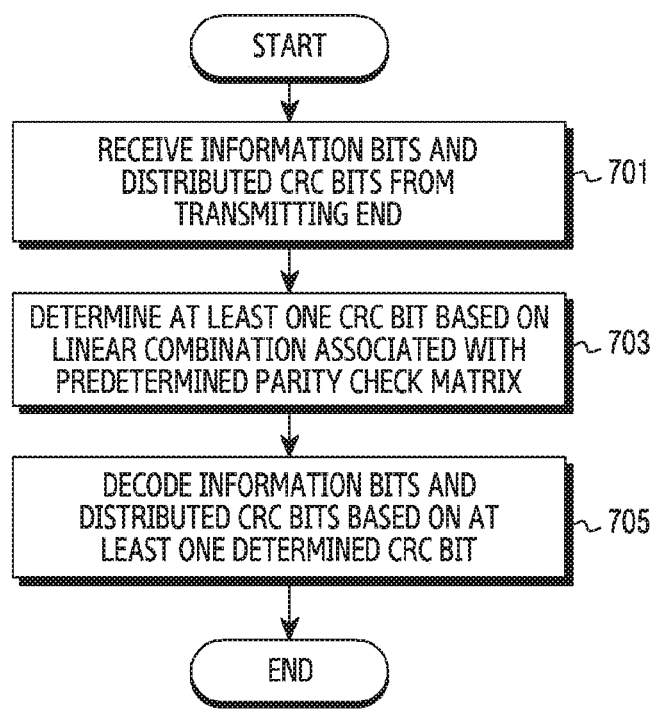
FIG. 7 is a flowchart illustrating an exemplary process in which a receiving end performs early termination when performing decoding based on distributed CRC in a wireless communication system according to various embodiments of the disclosure.

FIG. 7 is a flowchart illustrating a process in which a receiving end performs early termination when performing decoding based on distributed CRC in a wireless communication system according to various embodiments of the disclosure. FIG. 7 illustrates the operation method of the base station 110 or the terminal 120 as the operation of the receiving end.

Referring to FIG. 7, in operation 701, the receiving end may receive information bits and distributed CRC bits from a transmitting end. That is, the receiving end may receive the information bits and CRC bits from the transmitting end via interleaving. According to various embodiments, the receiving end may identify a predetermined parity check matrix that is generated via a predetermined CRC generator polynomial, based on the number of received information bits and the number of CRC bits to be used for error detection.

In operation 703, the receiving end may determine at least one CRC bit by a linear combination associated with the predetermined parity check matrix. For example, the receiving end may determine at least one CRC bit on which early termination is to be performed using the parity check matrix determined via a linear combination of rows of the predetermined parity check matrix. According to an embodiment, each row of the parity check matrix determined via the linear combination may indicate a check relational expression for a CRC bit. Although the check relational expression of the parity check matrix, determined via the linear combination of rows, is different from the existing check relational expression of the predetermined parity check matrix, the early termination feature may be maintained. However, the performance of the early termination may be different from that of the existing check relational expression of the predetermined parity check matrix. The above-described linear combination may include at least one of an AND operation, OR operation, NOT operation, and XOR operation on bits between rows of the predetermined parity check matrix. According to an embodiment, the predetermined parity check matrix and the parity check matrices determined by the linear combination of rows of the predetermined parity check matrix may be generated in advance, and may be stored in a storage unit of the receiving end.

In operation 705, the receiving end may decode the information bits and the distributed CRC bits based on the at least one determined CRC bit. For example, the receiving end may calculate a log likelihood ratio (LLR) corresponding to each bit of a polar code so as to perform successive cancellation list decoding. According to an embodiment, while the receiving end sequentially decodes bits via successive cancellation list decoding, when the CRC bit comes on which the early termination is to be performed, the receiving end may perform error checking using a check relational expression for the corresponding CRC bit, and may determine early termination.

Through the above-described process, the receiving end may determine check relational expressions that show early termination performance different from that of the check relational expression of the existing parity check matrix. Also, the receiving end may select a check relational expression showing the optimal early termination performance among the determined check relational expressions, and may perform error checking, thereby determining early termination.

Figure 8:
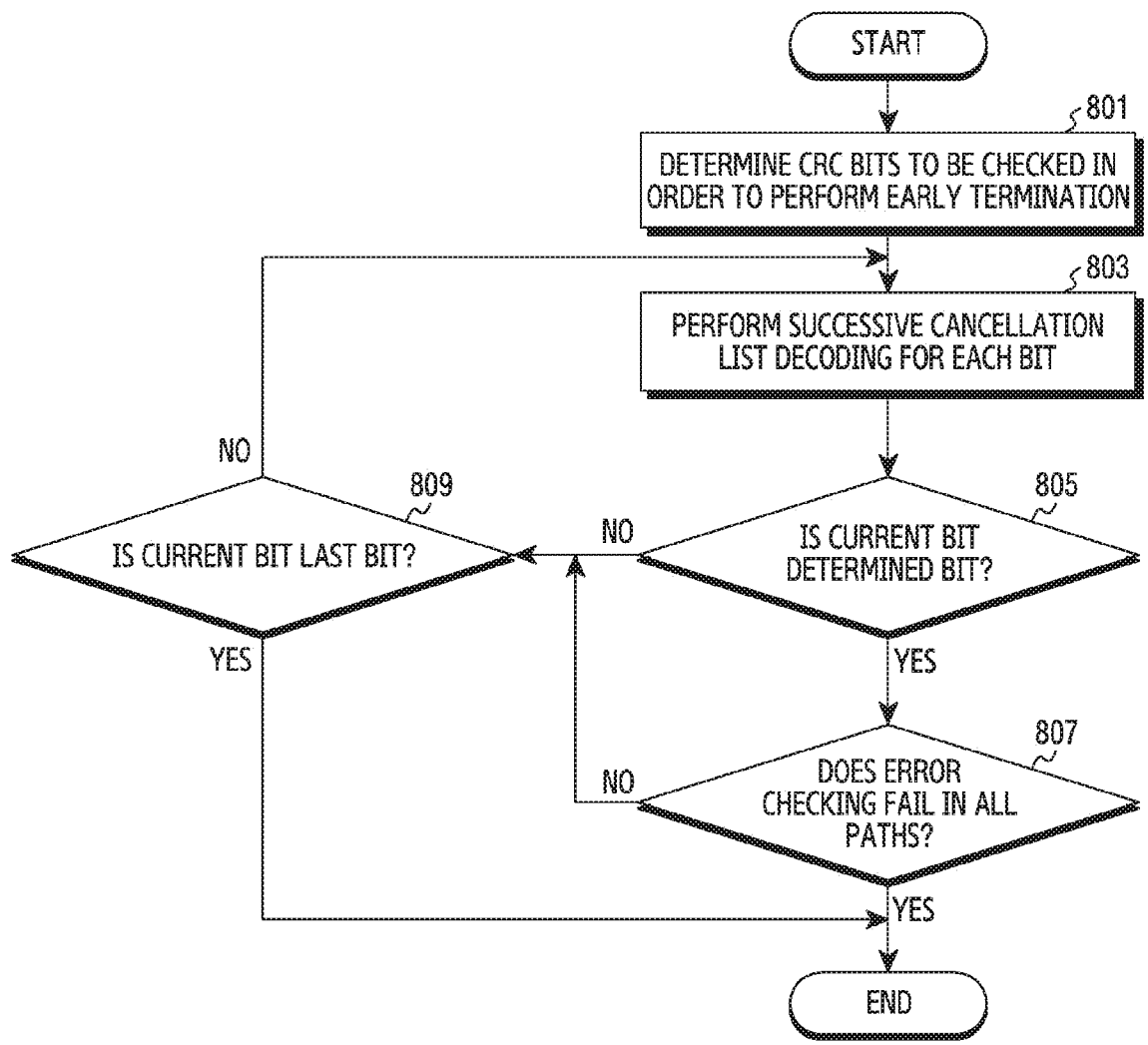
FIG. 8 is a flowchart illustrating another detailed process in which a receiving end performs decoding based on distributed CRC in a wireless communication system according to various embodiments of the disclosure.

FIG. 8 is a flowchart illustrating a detailed process in which a receiving end performs decoding based on distributed CRC in a wireless communication system according to various embodiments of the disclosure. FIG. 8 illustrates the operation method of the base station 110 or the terminal 120 as the operation of the receiving end.

Referring to FIG. 8, in operation 801, the receiving end may determine CRC bits to be checked for early termination. For example, the receiving end may determine at least one CRC bit on which early termination is to be performed using a parity check matrix determined by a linear combination of rows of a predetermined parity check matrix.

In operation 803, the receiving end may perform successive cancellation list decoding for each bit. For example, the receiving end may calculate a reliability value corresponding to each bit of polar codes that the receiving end desires to decode, and may input the above-described reliability value to a successive cancellation list decoder so as to perform decoding. Here, the reliability may be expressed using a LLR or the like.

In operation 805, the receiving end may determine whether the current bit is the determined bit. For example, the receiving end may sequentially perform successive cancellation list decoding with respect to a bit stream including the distributed CRC bits received from the transmitting end, and may determine whether a bit to be decoded is the CRC bit determined in operation 803. When the current bit is different from the determined CRC bit, the receiving end may determine whether the current bit is the last bit of the bit stream in operation 809. When the current bit is the determined CRC bit, the receiving end may proceed with operation 807.

In operation 807, the receiving end may determine whether checking fails in all paths. For example, when a bit to be decoded is the determined CRC bit while the receiving end performs successive cancellation list decoding, the receiving end may perform error checking based on the relational expression for the corresponding CRC bit, and may determine early termination of the successive cancellation list decoding. When error checking fails in all paths of the check relational expression of the corresponding CRC bit, the receiving end may terminate the operation. When error checking does not fail in all paths, the receiving end may proceed with operation 809. According to various embodiments, it may be determined that error checking fails for a path, when a path decoded bits of the path do not pass CRC checking.

In operation 809, the receiving end may determine whether the current bit is the last bit. For example, while the receiving end sequentially performs successive cancellation list decoding of a bit stream including the distributed CRC bits received from the transmitting end, when a bit to be decoded is different from the CRC bit determined for early termination, or when error checking fails in all paths of the check relational expression for the determined CRC bit, the receiving end may determine whether the current bit corresponds to the last bit of the bit stream. When the current bit does not correspond to the last bit of the bit stream, the receiving end may perform operation 803 again. When the current bit is the last bit of the bit stream, the receiving end may terminate the operation.

In the disclosure, when a CRC generator polynomial is expressed as g(x), and CRC bits, the number of which is "nCRC", are generated for K pieces of information bits, the ith row of the parity part of a CRC generator matrix may be coefficients of x(nCRC+i−1) mod g(x). Here, i is an integer ranging from 1 to K. The index of a row of the CRC generator matrix may increase from the bottom to the top. For example, K=25, nCRC=6, g(x)=x6+x5+x3+x2+x+1, and the form of the CRC generator matrix is G=[I P], the parity check matrix H=[P^T I] may be expressed as shown in FIG. 9A.

Figure 9A:
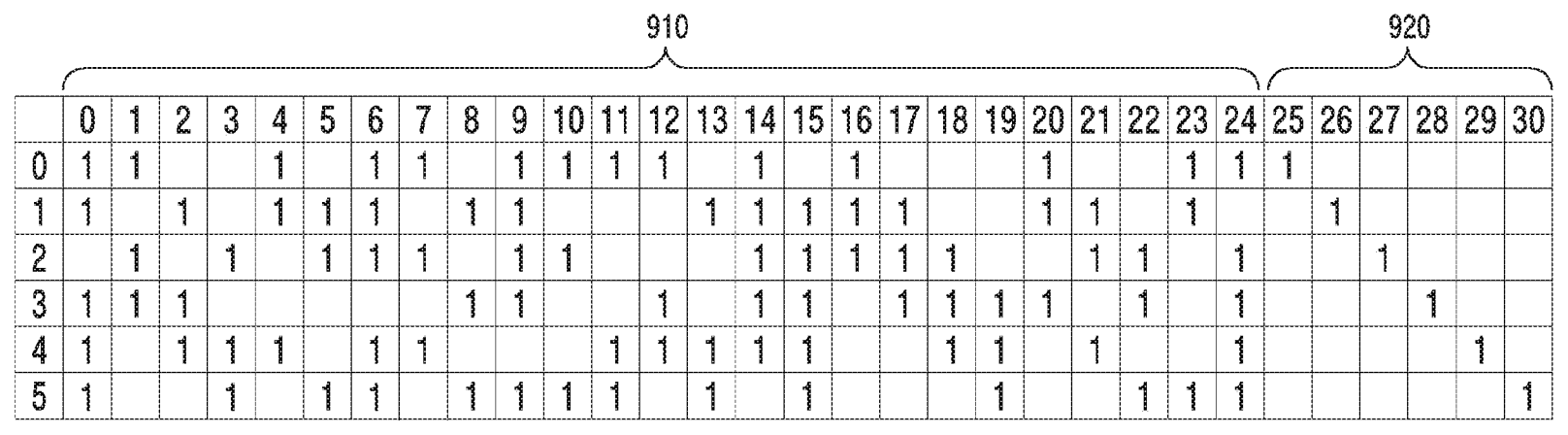

FIG. 9A illustrates an example of a linear combination associated with a predetermined parity check matrix in a wireless communication system according to various embodiments of the disclosure. Referring to FIG. 9A, a parity check matrix may include columns 910 with indices from 0 to 24 that correspond to 25 information bits, and columns 920 with indices from 25 to 30 that correspond to 6 CRC bits. In the case of FIG. 9A, the columns corresponding to the CRC bits may be in the form of a unit matrix.

Figure 9B:
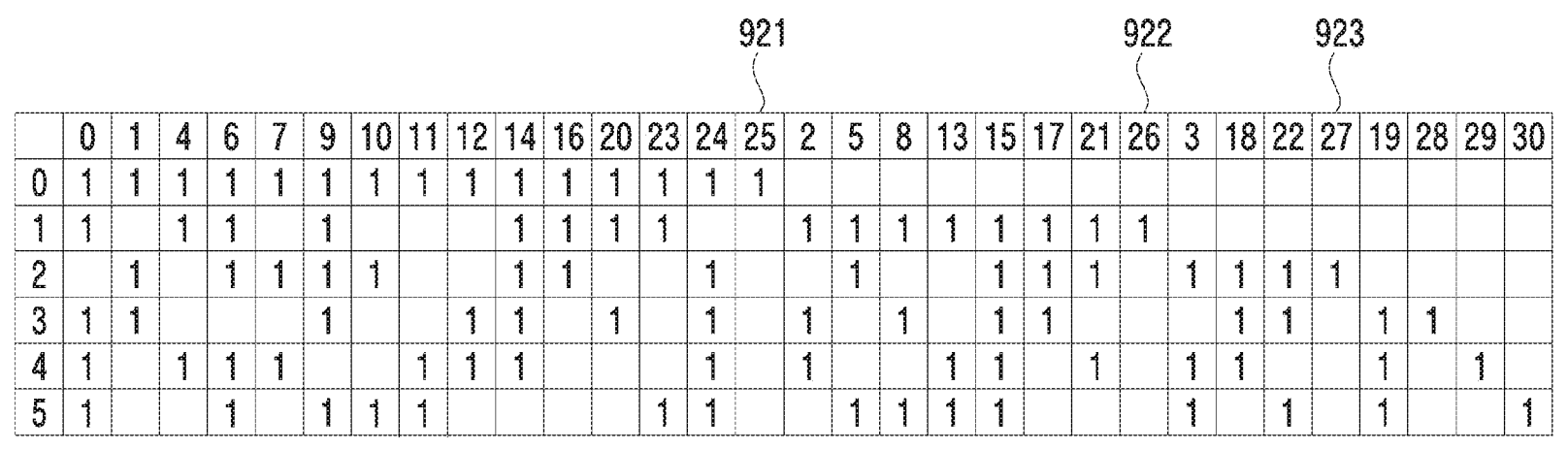

FIG. 9B illustrates an example of a linear combination associated with a predetermined parity check matrix in a wireless communication system according to various embodiments of the disclosure. FIG. 9B shows a parity check matrix including distributed CRC bits, which are generated by distributing three CRC bits to the parity check matrix of FIG. 9A via interleaving. Via interleaving, columns 921, 922, and 923 corresponding to the three CRC bits in the parity check matrix of FIG. 9A may be moved to locations existing between columns corresponding to information bits. According to the example of FIG. 9B, columns corresponding to the information bits in the parity check matrix may have a component of a parity check matrix at each of the rows corresponding to the columns 921, 922, and 923 corresponding to the three CRC bits. The columns 921, 922, and 923 corresponding to the CRC bits may be distributed to form check relational expressions only for the above-described components.

Figure 9C:
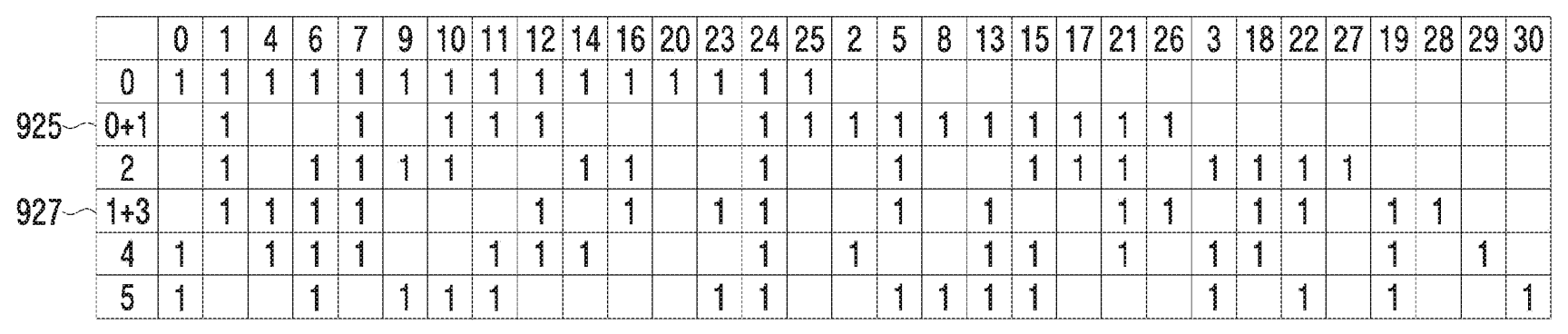

Via the linear combination of rows of the parity check matrix of FIG. 9B, a parity check matrix as shown in FIG. 9C may be determined. FIG. 9C illustrates an example of a linear combination associated with a predetermined parity check matrix in a wireless communication system according to various embodiments of the disclosure. Here, the linear combination associated with the predetermined parity check matrix may include a logical operation on bits between rows of the predetermined parity check matrix. According to various embodiments, the logical operation on bits may include at least one of AND operation, OR operation, NOT operation, and XOR operation between bits. For example, the second row 925 of the parity check matrix of FIG. 9C may be generated by applying an AND operation to the first row and the second row of the parity check matrix of FIG. 9B. Also, the fourth row 927 of the parity check matrix of FIG. 9C may be generated by applying an AND operation to the second row and the fourth row of the parity check matrix of FIG. 9B. According to an embodiment, the respective rows of the parity check matrix of FIG. 9C may indicate check relational expressions for columns corresponding to CRC bits. According to an embodiment, the receiving end may generate different check relational expressions which maintain an early termination feature, like the existing parity check matrix, via the above-described linear combination of rows of the parity check matrix. The receiving end may use different check relational expressions and may obtain early termination performance different from when the existing parity check matrix is used, and the receiving end may select the check relational expression having the best early termination performance among the generated check relational expressions.

According to an embodiment, the receiving end may use some or all of the CRC bits of the bit stream for early termination. For example, the receiving end may use some CRC bits of all of the CRC bits for early termination, and may use the remaining CRC bits for path disruption in order to improve decoding performance. That is, the receiving end may generate check relational expressions only for the selected bits, and may obtain an improved early termination gain by changing check relational expressions, without changing an interleaver obtained from the existing parity check matrix.

As described above, the disclosure may generate check relational expressions for columns corresponding to the CRC bits of a parity check matrix for early termination of decoding of a polar code by using distributed CRC. The generated check relational expressions may be generated using columns corresponding to CRC bits, as well as using columns corresponding to information bits. Through the above, an early termination gain increases and the complexity of an operation may be reduced.

According to various embodiments, the receiving end may use a successive cancellation flip decoding scheme as a method of decoding information bits which are encoded into a polar code. The successive cancellation flip decoding scheme basically uses a successive cancellation decoder as it is, and may provide a better block error rate (BLER) than the successive cancellation decoding scheme. In this instance, the successive cancellation flip decoding scheme has operation complexity higher than that of the successive cancellation decoding scheme, and the amount of delay time spent on the operation may be increased. Therefore, the successive cancellation flip decoding scheme may be effectively used in an application field where improvement of a block error rate is more important than improvement of the complexity of an operation. For example, among a plurality of application fields of the 5G communication system, in the case of massive machine-type communication (mMTC), each of a plurality of devices requires significantly low hardware complexity. In this instance, the hardware of a successive cancellation list decoder needs many units of memory and logic, and may not be suitable for mMTC. Therefore, in the case of mMTC, decoding may be performed using hardware which is the same as the successive cancellation decoder, instead of the successive cancellation list decoder, and may use the successive cancellation flip decoding scheme since the amount of delay time spent on an operation is not considered an important issue.

According to various embodiments, in the case of successive cancellation decoding, a bit error may occur due to the two following reasons. First, when the value that the receiving end receives from a channel is poor, an error may occur in decoding some information bits. Also, due to the characteristic of the successive cancellation decoding, the error propagates to the bits subsequent to the bit where the decoding error occurs, whereby an additional error may occur. However, the reasons that a bit error occurs according to the disclosure are not limited to the above-described two reasons, and a bit error may occur according to various embodiments.

According to various embodiments, errors that occur during successive cancellation decoding may mainly include an error caused by a single channel and errors attributable to propagation of the error. Therefore, when the point where a first error occurs is promptly detected, the receiving end may flip a bit to be used for error checking for decoding at the point where the error occurs, and may perform successive cancellation decoding on the remaining bits. In this instance, the receiving end may decode information bits of the entire received frame without an error. Successive cancellation flip decoding is used to address the above error issues. In order to perform successive cancellation flip decoding, CRC bits may be used by connecting the CRC bits to information bits.

The procedure of normal successive cancellation flip decoding is as follows. First, the receiving end may perform normal successive cancellation decoding on received information bits. Second, the receiving end may perform error checking on CRC bits connected to the information bits. When error checking is successfully performed, decoding is terminated normally. Third, when error checking fails, the receiving end may configure candidate groups of information bits which are expected to have a channel-based error associated with a first channel, according to a predetermined criterion. Forth, the receiving end may arrange the information bits of the configured candidate groups in order of reliability. In this instance, the arrangement may be performed in advance according to a predetermined criterion. Fifth, the receiving end may flip the first bit among the information bits of the candidate groups which are arranged in order of reliability, and may proceed with normal successive cancellation decoding again. For example, flipping indicates changing a bit value of 0 to a bit value of 1 or changing a bit value of 1 to a bit value of 0. Sixth, when performing normal successive cancellation decoding, the receiving end may perform error checking on the CRC bits connected to the information bits. When the error check is successfully performed, decoding is terminated normally. However, if the error checking fails, the receiving end may again flip a bit that is disposed first among the information bits of the candidate groups, and may proceed with normal successive cancellation decoding. Seventh, if the error check fails, although flip decoding is performed with respect to all information bits of the candidate groups, the receiving end may terminate decoding.

According to various embodiments, when the receiving end flips information bits one by one and performs additional successive cancellation decoding a maximum of T times, the receiving end may select information bits to flip. The receiving end may select T locations where the absolute value of a LLR is the smallest while performing decoding on the basis of a criterion for selecting information bits to flip. Also, the receiving end may measure, in advance, the frequency of occurrence of an error caused by a first channel for each location of a bit, and may determine T locations where a channel-based error most frequently occurs. When an LLR is used, the receiving end may need to perform arrangement based on LLR values every time the receiving end performs successive cancellation decoding. Conversely, when the frequency of occurrence of an error for each location is used, T locations may be configured in advance in a predetermined order, which is advantageous. The above-described criteria may be used in combination, and this shows better performance than when each criterion is used alone.

According to various embodiments, when the receiving end performs successive cancellation flip decoding, the receiving end may perform a successive cancellation decoding operation a maximum of T+1 times. When the receiving end performs a successive cancellation decoding operation T+1 times, the complexity of the operation is high. Accordingly, a distributed CRC scheme may be used instead of a normal CRC scheme that connects CRC bits to the end of information bits. In this instance, in order to configure T candidate bits for flipping, information associated with a CRC bit on which error checking fails may be used for successive cancellation flip decoding. When the receiving end uses the distributed CRC in the successive cancellation flip decoding scheme, the receiving end may reduce the complexity of a repeatedly performed decoding operation, and may more accurately select candidate bits compared to the existing successive cancellation flip decoding scheme.

Figure 10:
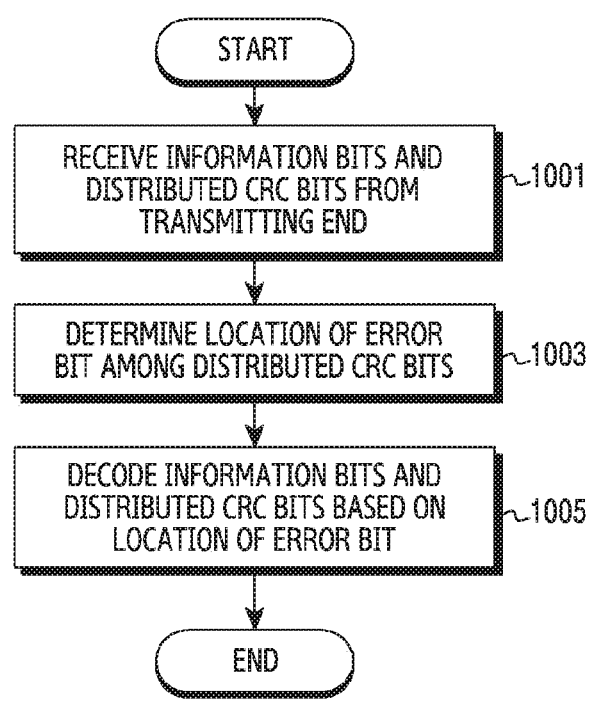
FIG. 10 is a flowchart illustrating an exemplary process in which a receiving end performs successive cancellation flip decoding based on distributed CRC in a wireless communication system according to various embodiments of the disclosure.

FIG. 10 is a flowchart illustrating a process in which a receiving end performs successive cancellation flip decoding based on distributed CRC in a wireless communication system according to various embodiments of the disclosure. FIG. 10 illustrates the operation method of the base station 110 or the terminal 120 as the operation of the receiving end.

Referring to FIG. 10, in operation 1001, the receiving end may receive information bits and distributed CRC bits from a transmitting end. That is, the receiving end may receive the information bits and the distributed CRC bits from the transmitting end via interleaving.

In operation 1003, the receiving end may determine the location of an error bit among the distributed CRC bits. For example, the information bits and the distributed CRC bits have a feature of early termination during decoding, and thus the receiving end may perform successive cancellation decoding having an early termination feature. According to an embodiment, the receiving end may perform error checking on the distributed CRC bits, and may determine the CRC bit on which error checking fails first. The receiving end may determine the location of an error bit to flip according to a predetermined criterion corresponding to the CRC bit on which error checking fails.

In operation 1005, the receiving end may decode the information bits and the distributed CRC bits based on the location of the error bit. For example, when the receiving end performs decoding at the location of the error bit determined in operation 1003 while performing successive cancellation decoding on the information bits and the distributed CRC bits, the receiving end may flip the decoding result of a bit at the corresponding location, and may continue successive cancellation decoding.

Figure 11:
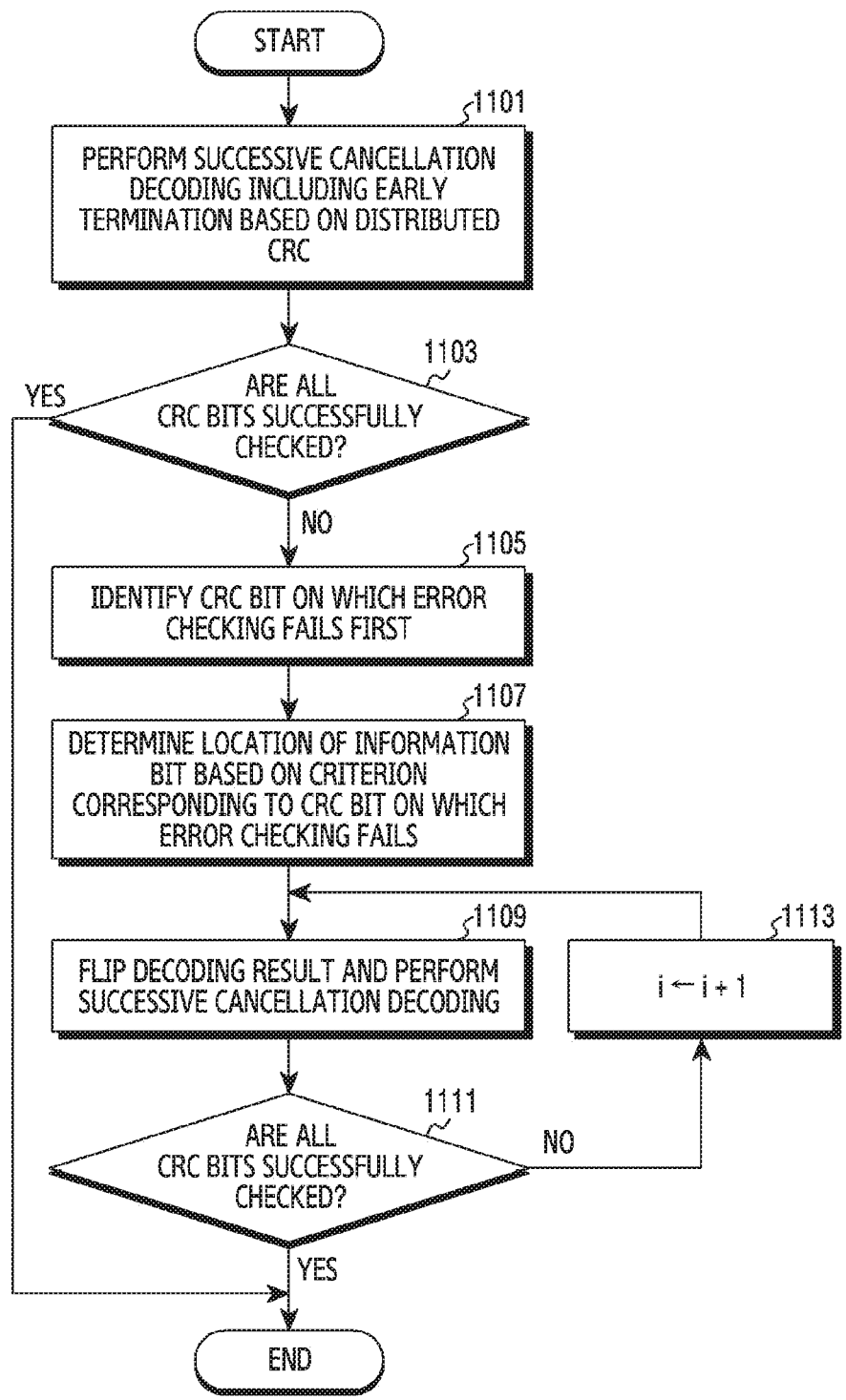
FIG. 11 is a flowchart illustrating a detailed exemplary process in which a receiving end performs successive cancellation flip decoding based on distributed CRC in a wireless communication system according to various embodiments of the disclosure.

FIG. 11 is a flowchart illustrating a detailed process in which a receiving end performs successive cancellation flip decoding based on distributed CRC in a wireless communication system according to various embodiments of the disclosure. FIG. 11 illustrates the operation method of the base station 110 or the terminal 120 as a receiving end.

Referring to FIG. 11, in operation 1101, the receiving end may perform successive cancellation decoding including a feature of early termination based on distributed CRC. For example, the receiving end performs successive cancellation decoding on the information bits and distributed CRC bits received from a transmitting end. The CRC bits are distributed via interleaving, and thus may have a feature of early termination. The receiving end may perform successive cancellation decoding using the early termination feature of the distributed CRC, and thus may reduce the amount of operations.

In operation 1103, the receiving end may determine whether error checking is successfully performed with respect to all CRC bits. For example, the receiving end may perform successive cancellation decoding using the early termination feature of the distributed CRC. When error checking with respect to all CRC bits is successfully performed, the receiving end may terminate the operation. When error checking with respect to all CRC bits is not successfully performed, the receiving end may proceed with operation 1105. According to various embodiments, it may be determined that error checking fails for a path, when a path decoded bits of the path do not pass CRC checking.

In operation 1105, the receiving end may identify the CRC bit on which error checking fails first. That is, when error checking with respect to all distributed CRC bits is not successfully performed, the receiving end may determine the CRC bit on which error checking fails.

In operation 1107, the receiving end may determine the location of an information bit according to a criterion corresponding to the CRC bit on which the error checking fails. For example, the receiving end may determine the locations of T information bits based on a predetermined criterion corresponding to the CRC bit on which error checking fails. Here, T is an arbitrary value, and may indicate the number of bits to be flipped. According to an embodiment, the receiving end may determine an index i, which is used for repeatedly performing successive cancellation decoding, to be an initial value, that is, 1.

In operation 1109, the receiving end may flip a decoding result, and may perform successive cancellation decoding. For example, the receiving end may perform successive cancellation decoding using an early termination feature of the distributed CRC, may flip a decoding result at an information bit having the index i, and may continue successive cancellation decoding.

In operation 1111, the receiving end may determine whether error checking with respect to all CRC bits is successively performed. That is, the receiving end performs successive cancelation decoding on information bits, and may determine whether error checking on all distributed CRC bits is successively performed. When error checking with respect to all distributed CRC bits is not successively performed, the receiving end may increase the index i by 1 in operation 1113, and may proceed with operation 1109 again.

Through the above-described processes, when the receiving end performs decoding a maximum of T+1 times, the receiving end may perform early termination based on the distributed CRC for each successive cancellation decoding so as to reduce the amount of operations. Also, when the receiving end determines T information bits to flip, the receiving end may perform successive cancellation decoding by taking into consideration the location of a distributed CRC bit where decoding is terminated during first successive cancellation decoding, whereby error correction performance may be improved.

Figure 12A:
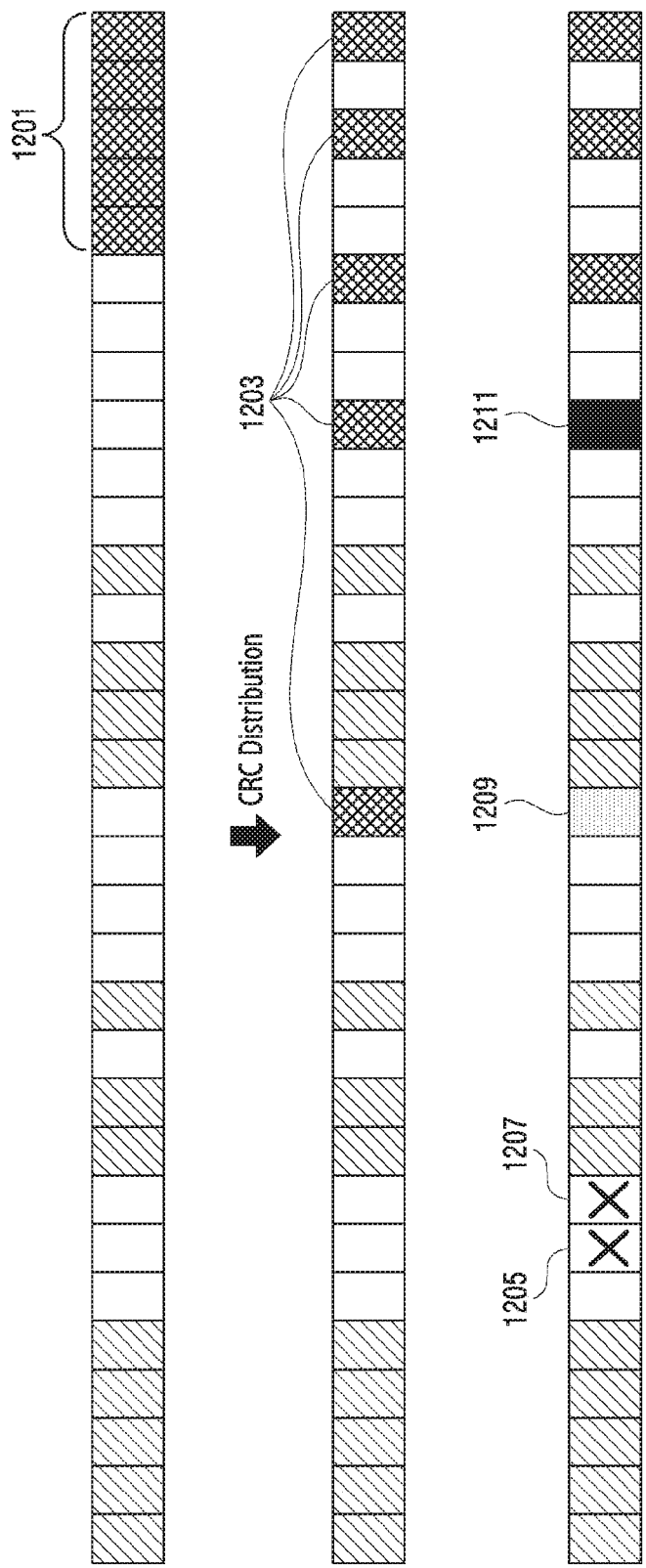
FIG. 12A illustrates an example of performing successive cancellation flip decoding based on distributed CRC in a wireless communication system according to various embodiments of the disclosure.
Figure 12B:
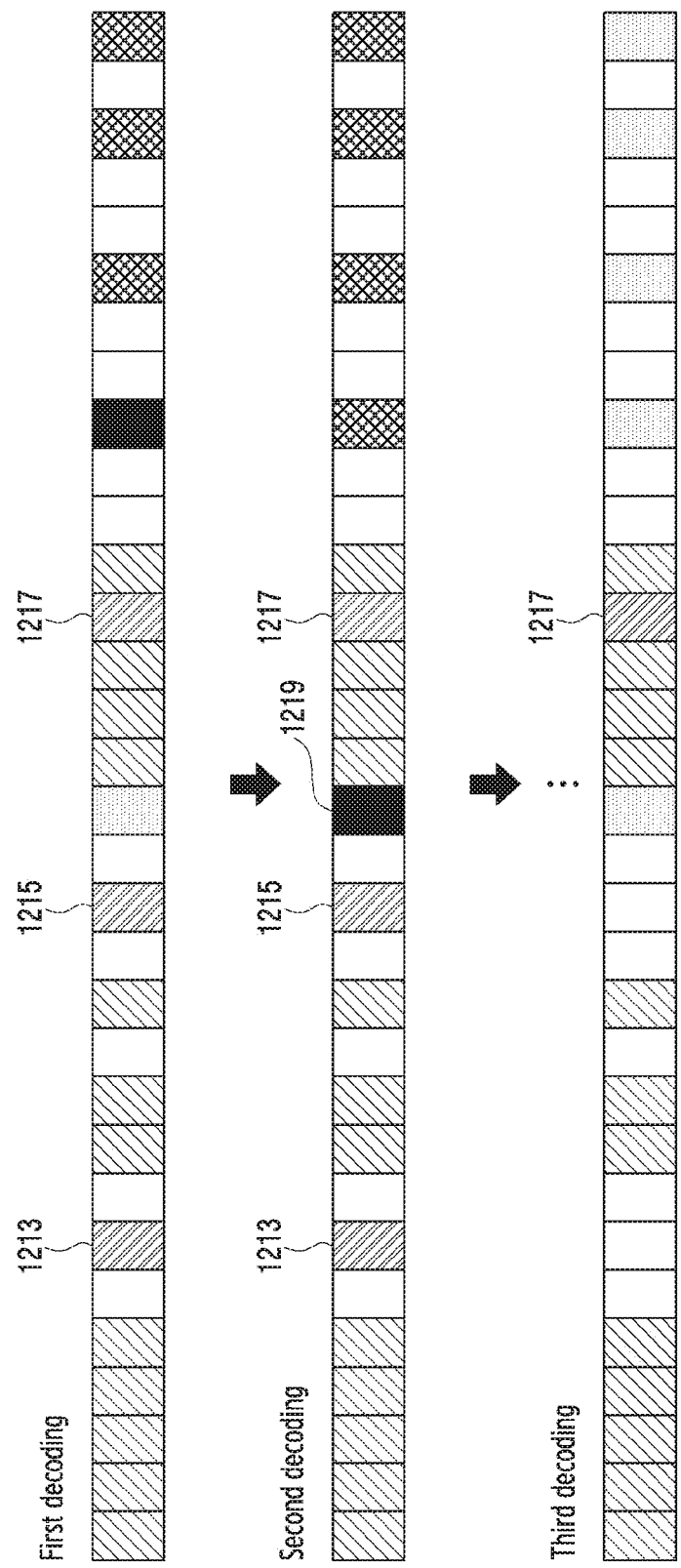
FIG. 12B illustrates an example of performing successive cancellation flip decoding based on distributed CRC in a wireless communication system according to various embodiments of the disclosure.

FIGS. 12A and 12B illustrate examples of performing successive cancellation flip decoding based on distributed CRC in a wireless communication system according to various embodiments of the disclosure.

Referring to FIG. 12A, CRC bits 1201 appended to information bits may be distributed so as to be located among information bits according to a CRC distribution scheme as described above. Successive cancellation decoding may be performed with respect to the information bits and the distributed CRC bits 1203. When a value received from a channel is poor, bit errors 1205 and 1207 may occur during successive cancellation decoding. Due to the characteristics of successive cancellation decoding, bit errors may include a first error bit 1205 where a decoding error occurs and a second error bit 1207 to which the error attributable to the first error bit propagates. The receiving end may perform error checking on the distributed CRC bits 1203. The receiving end may successfully or unsuccessfully perform error checking with respect to all or some of the distributed CRC bits 1203. For example, error checking on a first CRC bit 1209 of the distributed CRC bits 1203 may be successfully performed, and error checking on a second CRC bit 1211 may fail.

Referring to FIG. 12B, the receiving end may identify a CRC bit where error checking fails first during first decoding. For example, the receiving end may identify that error checking fails first at the second CRC bit 1211 among the distributed CRC bits of FIG. 12A. The receiving end may determine the locations of information bits 1213, 1215, and 1217 according to a predetermined criterion corresponding to the second CRC bit 1211. The receiving end may flip the first information bit 1213, among the information bits 1213, 1215, and 1217, and may proceed with second decoding. During second decoding, the receiving end may identify that error checking of a CRC bit 1219 has failed. In this instance, the receiving end may flip the second information bit 1215, and may proceed with successive cancellation decoding. The receiving end may repeatedly perform the above-described process, and may determine whether error checking is successfully performed with respect to all distributed CRC bits. For example, during fourth decoding, the receiving end may identify that check is successfully performed with respect to all distributed CRC bits, and may terminate successive cancellation flip decoding based on distributed CRC.

Figure 13:
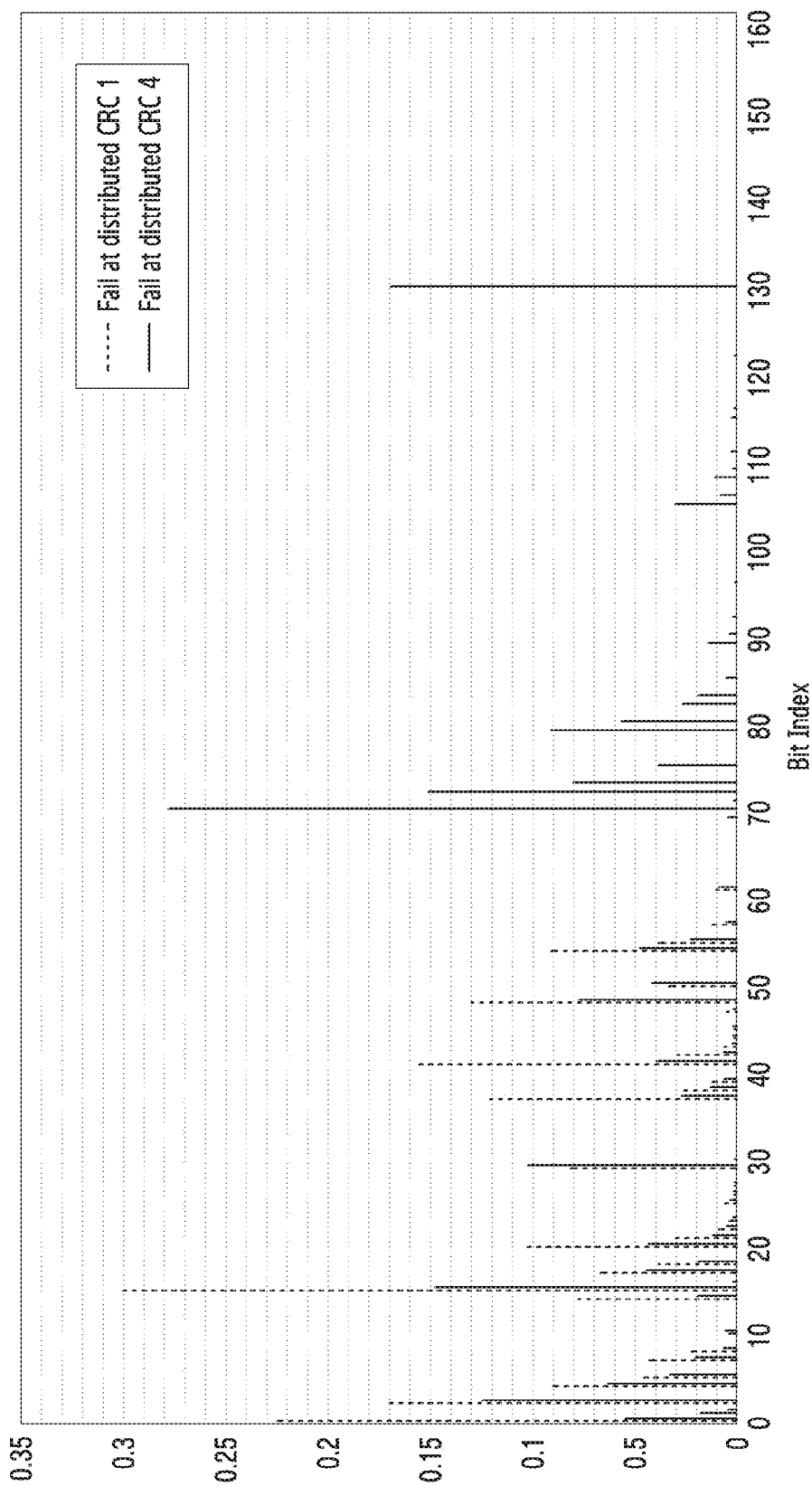
FIG. 13 illustrates an exemplary resultant graph of a simulation associated with successive cancellation flip decoding based on distributed CRC in a wireless communication system according to various embodiments of the disclosure.

FIG. 13 illustrates an exemplary resultant graph of a simulation of successive cancellation flip decoding based on distributed CRC in a wireless communication system according to various embodiments of the disclosure.

In the case of successive cancellation flip decoding, bits selected to be flipped may be changed depending on a CRC bit where decoding is terminated during first successive cancellation decoding. For example, FIG. 13 shows a graph which is obtained by plotting the relative value of the number of times that an error caused by a first channel occurs for each location in association with 24-bit CRC, used in 3GPP, when the length of a code to be decoded (N) is 1024 and the number of information bits (K) is 138. Comparing the case in which error checking on a first CRC bit fails and the case in which error checking on a fourth CRC bit fails, it is identified that they have different distributions of errors caused by the first channel. The distributions may differentiate T bits which are to be selected when error checking fails for each CRC bit. Through the above, the error correction performance of the successive cancellation flip decoding scheme based on distributed CRC may be improved so as to be better than that of the existing successive cancellation flip decoding scheme.

Figure 14:
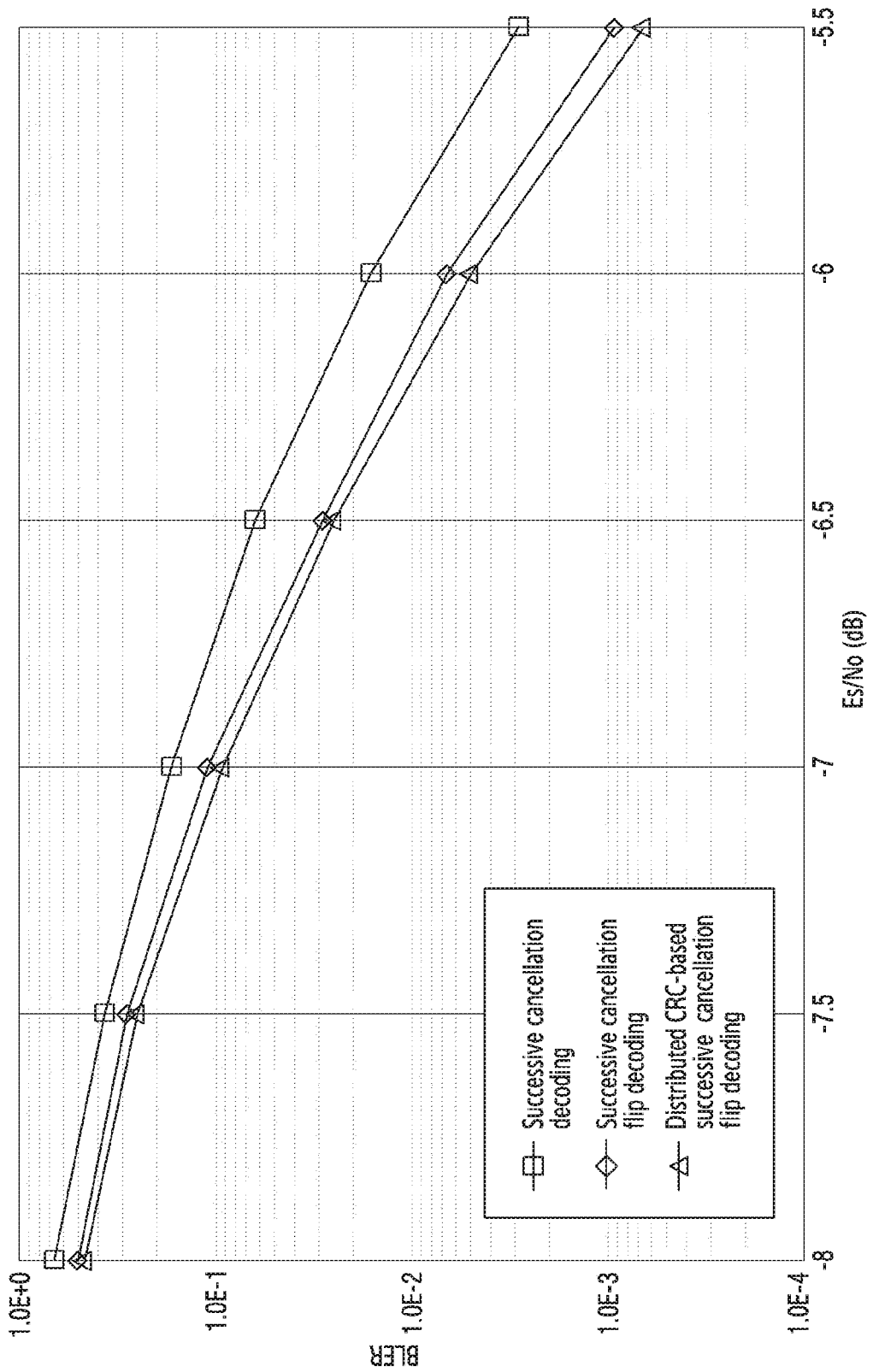
FIG. 14 illustrates an n exemplary resultant graph of a simulation associated with the performance of successive cancellation flip decoding based on distributed CRC in a wireless communication system according to various embodiments of the disclosure.

FIG. 14 illustrates an exemplary resultant graph of a simulation associated with performance of successive cancellation flip decoding based on distributed CRC in a wireless communication system according to various embodiments of the disclosure.

Referring to FIG. 14, when the length of a code to be decoded (N) is 1024, the number of information bits (K) is 138, and the number of bits to be selected (T) when error checking fails is 10, it is identified that the successive cancellation flip decoding based on distributed CRC has a lower block error rate (BLER) than those of the successive cancellation decoding and the existing successive cancellation flip decoding. When the receiving end performs first decoding using distributed CRC, the receiving end may select bits to flip based on the location of a CRC bit where decoding is terminated, whereby the overall decoding performance may be improved.

According to various embodiments, successive cancellation list decoding may be performed using a parity check matrix determined on the basis of a linear combination of rows of a predetermined parity check matrix. For example, the result of simulating the case in which CRC distribution is performed using 24-bit CRC defined in 3GPP and a corresponding interleaver is as shown in Table 1.

TABLE 1

| SNR($E_S/N_0$) (dB) | predetermined parity check matrix | | | parity check matrix determined by linear combination | | | rate of increase (%) |
| --- | --- | --- | --- | --- | --- | --- | --- |
| | early termination rate | early termination gain | overall gain of early termination | early termination rate | early termination gain | overall gain of early termination | |
| −0.5 | 0.05 | 0.237 | 0.012 | 0.08 | 0.201 | 0.016 | 36 |
| 0 | 0.08 | 0.244 | 0.020 | 0.09 | 0.259 | 0.023 | 19 |
| 0.5 | 0.03 | 0.035 | 0.001 | 0.03 | 0.074 | 0.002 | 111 |
| 1 | 0.06 | 0.383 | 0.023 | 0.09 | 0.280 | 0.025 | 10 |
| 1.5 | 0.02 | 0.510 | 0.010 | 0.07 | 0.199 | 0.014 | 37 |
| 2 | 0.03 | 0.417 | 0.013 | 0.04 | 0.320 | 0.013 | 2 |

When the length of a code to be decoded (N) is 256 and the number of information bits (K) is 104, as the parameters of the code, the number of distributed CRC bits may be 7. In order to obtain a check relational expression that maximizes an early termination gain, a parity check matrix of a CRC code is configured, and a row-based linear combination is performed with respect to 5 rows of the parity check matrix, which correspond to the first 5 bits of the CRC bits. In this instance, a total of 1024 unsystematic matrices may exist, and an early termination gain obtained when early termination is performed for all matrices may be calculated. According to various embodiments, the early termination gain associated with one distributed CRC bit, when decoding is early terminated at the corresponding location, may be defined to be the ratio of information bits that are not yet decoded. The early termination gain of all distributed CRC bits may be defined to be the average of the early termination gains of the respective distributed CRC bits. The overall gain of early termination may be defined to be the product of an early termination rate and the early termination gain of all distributed CRC bits. An early termination gain obtained by deriving the optimal check relational expression may be as shown in Table 1. Referring to Table 1, for all SNRs, the early termination scheme that uses a linear combination associated with a predetermined parity check matrix of the disclosure shows an early termination gain higher than that of the existing early termination scheme that uses the predetermined parity check matrix, and shows a 19.8% decrease in the overall complexity of operations.

According to various embodiments, Table 2 shows the result of a simulation that compares performance between the successive cancellation flip decoding scheme of the disclosure and the existing successive cancellation flip decoding in association with 24-bit CRC defined in 3GPP when successive cancellation flip decoding is performed based on distributed CRC, the length of a code to be decoded (N) is 1024, the number of information bits (K) is 138, and the number of bits to be selected (T) when error checking fails is 10.

TABLE 2

| | average number of times that decoding is performed | | |
| --- | --- | --- | --- |
| SNR ($E_S/N_0$) (dB) | successive cancellation flip decoding | successive cancellation flip decoding based on distributed CRC | rate of decrease (%) |
| −8.0 | 9.664 | 6.870 | 28.9 |
| −7.5 | 9.907 | 7.187 | 27.5 |
| −7.0 | 9.128 | 6.504 | 28.7 |
| −6.5 | 8.275 | 6.156 | 25.6 |
| −6.0 | 7.773 | 5.482 | 29.5 |

The simulation that obtains the result shown in Table 2 has been performed using a polar code sequence defined in 3GPP and the BPSK modulation with an AWGN channel. In Table 2, the average number of times that decoding is performed may include the total number of times that successive cancellation decoding is performed (including first decoding) until decoding is successfully performed when the existing successive cancellation flip decoding is applied with respect to error frames on which error checking fails, and the total number of times that successive cancellation decoding is performed in consideration of early termination gain based on distributed CRC when successive cancellation flip decoding based on distributed CRC according to the disclosure is performed. That is, when the average number of times that decoding is performed is one (1), the one (1) indicates the amount of an operation corresponding to successive decoding that is performed once. For example, when an SNR(Es/No) value is −5.5 dB, it is identified that the complexity of an operation is decreased by 30%. The decrease in the complexity of an operation is similarly observed from the entire SNR values.

As described above, an electronic device and an operation method therefor according to various embodiments may include receiving information bits and distributed CRC bits from a transmitting end, and decoding the information bits and the distributed CRC bits according to a successive cancellation list decoding scheme that uses a parity check matrix determined by a linear combination of rows of a predetermined parity check matrix or according to a successive cancellation flip decoding scheme using distributed CRC bits.

According to the above-described embodiments, polar coding may be applied in order to encode bits which are to be decoded. In new radio (NR), a polar code may be used for channel coding associated with a broadcast channel (BCH), and may be used for encoding control information such as downlink control information (DCI) and uplink control information (UCI). Therefore, in the disclosure, signals that the receiving end receives from the transmitting end may include control information such as the above-described DCI and UCI.

Methods according to embodiments stated in claims and/or specifications of the disclosure may be implemented in hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs), or other type optical storage devices, or a magnetic cassette. Alternatively, any combination of some or all of the may form a memory in which the program is stored. Further, a plurality of such memories may be included in the electronic device.

In addition, the programs may be stored in an attachable storage device which is accessible through communication networks such as the Internet, Intranet, local area network (LAN), wide area network (WAN), and storage area network (SAN), or a combination thereof. Such a storage device may access the electronic device via an external port. Further, a separate storage device on the communication network may access a portable electronic device.

In the above-described detailed embodiments of the disclosure, a component included in the disclosure is expressed in the singular or the plural according to a presented detailed embodiment. However, the singular form or plural form is selected for convenience of description suitable for the presented situation, and various embodiments of the disclosure are not limited to a single element or multiple elements thereof. Further, either multiple elements expressed in the description may be configured into a single element or a single element in the description may be configured into multiple elements.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

Although the disclosure has been described with various embodiments, various changes and modifications may be suggested to one skilled in the art. It is intended that the disclosure encompass such changes and modifications as fall within the scope of the appended claims.

What is claimed is:

1. A method for operating a first device in a wireless communication system, the method comprising:
   receiving information bits and distributed cyclic redundancy check (CRC) bits from a second device; and
   decoding the information bits and the distributed CRC bits,
   wherein the information bits and the distributed CRC bits are decoded by using a successive cancellation list decoding that uses a parity check matrix determined based on a linear combination of rows of a predetermined parity check matrix, or by using a successive cancellation flip decoding that uses flipping a decoding result associated with at least one of the decoded distributed CRC bits.

2. The method of claim 1, wherein the linear combination of rows of the predetermined parity check matrix comprises at least one of an AND operation, an OR operation, a NOT operation, or an XOR operation on bits between rows of the predetermined parity check matrix.

3. The method of claim 1, wherein the predetermined parity check matrix comprises a parity check matrix that is used by the second device to generate the distributed CRC bits.

4. The method of claim 1, wherein a check relational expression of the parity check matrix determined based on the linear combination of rows of the predetermined parity check matrix has a feature of an early termination which is different from a feature of a check relational expression of the predetermined parity check matrix.

5. The method of claim 1, wherein the decoding the information bits and the distributed CRC bits comprises:
   performing an error checking on the decoded information bits using one of the distributed CRC bits so as to determine whether to perform an early termination.

6. The method of claim 5, wherein the determining whether to perform the early termination comprises:
   performing the successive cancellation list decoding on the information bits and the distributed CRC bits;
   performing the error checking using the distributed CRC bits corresponding to a plurality of paths; and
   determining to perform the early termination based upon detecting an error from at least one of the plurality of paths.

7. The method of claim 6, further comprising:
   suspending the successive cancellation list decoding on the information bits and the distributed CRC bits when the early termination is determined.

8. The method of claim 1, wherein the decoding the information bits and the distributed CRC bits comprises:
   decoding one of the information bits and the distributed CRC bits;
   successively decoding a subsequent bit based on a decoding result of the decoded bits; and
   when the subsequent bit is one of the distributed CRC bits:
      flipping a decoding result associated with one of at least one decoded bit corresponding to the one of the distributed CRC bits, and
      performing a successive cancellation decoding based on the flipped decoding result.

9. The method of claim 1, wherein the information bits and the distributed CRC bits are encoded into a polar code.

10. The method of claim 1, wherein the information bits and the distributed CRC bits comprise downlink control information or uplink control information.

11. An apparatus as a first device in a wireless communication system, the apparatus comprising:
   a transceiver configured to receive information bits and distributed cyclic redundancy check (CRC) bits from a second device; and
   at least one processor configured to decode the information bits and the distributed CRC bits,
   wherein the information bits and the distributed CRC bits are decoded by using a successive cancellation list decoding that uses a parity check matrix determined based on a linear combination of rows of a predetermined parity check matrix, or by using a successive cancellation flip decoding that uses flipping a decoding result associated with at least one of the decoded distributed CRC bits.

12. The apparatus of claim 11, wherein the linear combination of rows of the predetermined parity check matrix comprises at least one of an AND operation, an OR operation, a NOT operation, or an XOR operation on bits between rows of the predetermined parity check matrix.

13. The apparatus of claim 11, wherein the predetermined parity check matrix comprises a parity check matrix that is used by the second device to generate the distributed CRC bits.

14. The apparatus of claim 11, wherein a check relational expression of the parity check matrix determined based on the linear combination of rows of the predetermined parity check matrix has a feature of an early termination that is different from a feature of a check relational expression of the predetermined parity check matrix.

15. The apparatus of claim 11, wherein the at least one processor is further configured to perform an error checking on the decoded information bits using one of the distributed CRC bits so as to determine whether to perform an early termination.

16. The apparatus of claim 15, wherein the at least one processor is further configured to:
- perform the successive cancellation list decoding on the information bits and the distributed CRC bits;
- perform the error checking using the distributed CRC bits corresponding to a plurality of paths; and
- determine to perform the early termination based upon detecting an error from at least one of the plurality of paths.

17. The apparatus of claim 16, wherein the at least one processor is further configured to suspend the successive cancellation list decoding on the information bits and the distributed CRC bits when the early termination is determined.

18. The apparatus of claim 11, wherein the at least one processor is further configured to:
- decode one of the information bits and the distributed CRC bits;
- successively decode a subsequent bit based on a decoding result of the decoded bits; and
- when the subsequent bit is one of the distributed CRC bits:
    - flip a decoding result associated with one of at least one decoded bit corresponding to the one of the distributed CRC bits, and
    - perform a successive cancellation decoding based on the flipped decoding result.

19. The apparatus of claim 11, wherein the information bits and the distributed CRC bits are encoded into a polar code.

20. The apparatus of claim 11, wherein the information bits and the distributed CRC bits comprise downlink control information or uplink control information.

* * * * *